United States Patent
Eun

(10) Patent No.: US 7,385,277 B2
(45) Date of Patent: Jun. 10, 2008

(54) SEMICONDUCTOR CHIP AND METHOD OF FABRICATING THE SAME

(75) Inventor: Hyung-Lae Eun, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/594,178

(22) Filed: Nov. 8, 2006

(65) Prior Publication Data
US 2007/0102793 A1 May 10, 2007

(30) Foreign Application Priority Data
Nov. 9, 2005 (KR) .................. 10-2005-0107015

(51) Int. Cl.
*H01L 23/58* (2006.01)
(52) U.S. Cl. ................. 257/638; 257/E23.002
(58) Field of Classification Search ........... 257/620, 257/632, 635, 638, 642, 643, E23.002; 438/460–465, 438/690–692
See application file for complete search history.

(56) References Cited

U.S. PATENT DOCUMENTS

| | | | | |
|---|---|---|---|---|
| 4,904,610 A | * | 2/1990 | Shyr | 438/463 |
| 6,335,561 B2 | * | 1/2002 | Imoto | 257/626 |
| 6,429,042 B1 | * | 8/2002 | Guida | 438/106 |
| 6,576,990 B2 | * | 6/2003 | Flesher et al. | 257/679 |
| 6,897,164 B2 | * | 5/2005 | Baude et al. | 438/780 |
| 7,129,565 B2 | * | 10/2006 | Watanabe et al. | 257/620 |
| 7,170,152 B2 | * | 1/2007 | Huang et al. | 257/678 |
| 7,198,969 B1 | * | 4/2007 | Khandros et al. | 438/33 |
| 2006/0076649 A1 | * | 4/2006 | Letertre et al. | 257/619 |

FOREIGN PATENT DOCUMENTS

| KR | 10-2001-0001597 | 1/2001 |
|---|---|---|
| KR | 10-2005-0047873 | 5/2005 |

OTHER PUBLICATIONS

On the Mechanism of Thymine Photodimerization□□by A. A. Lamola and J. Eisinger□□Bell Telephone Laboratories, Murray Hill, New Jersey□□Communicated by W. O. Baker, Oct. 30, 1967.*

* cited by examiner

*Primary Examiner*—David A Zarneke
(74) *Attorney, Agent, or Firm*—Harness, Dickey & Pierce, P.L.C.

(57) ABSTRACT

A semiconductor chip may include a semiconductor substrate that may have a semiconductor device pattern. A passivation layer may be provided on a surface of the semiconductor substrate. At least one elastic protecting layer may be provided on the passivation layer. The elastic protecting layer may have a pattern composed of grooves formed on a surface.

25 Claims, 4 Drawing Sheets

SEMICONDUCTOR CHIP AND METHOD OF FABRICATING THE SAME

PRIORITY STATEMENT

This U.S. non-provisional application claims benefit of priority under 35 U.S.C. §119 from Korean Patent Application No. 10-2005-0107015, filed on Nov. 9, 2005, in the Korean Intellectual Property Office (KIPO), the disclosure of which is incorporated herein by reference.

BACKGROUND

1. Field

Example non-limiting embodiments relate to a semiconductor device and a method of fabricating the same, for example, to a semiconductor chip and a method of fabricating the same.

2. Description of the Related Art

In recent years, with the production of compact-sized semiconductor products, efforts have been continuously made to reduce the thickness of a semiconductor package. One of the methods of reducing the thickness of a semiconductor package is to perform a back-side polishing process on a semiconductor substrate. Through the back-side polishing process, unnecessary electric junction of a semiconductor substrate body interfering with back contact conduction may be removed, and the heat releasing performance of the semiconductor package may be improved.

For example, a thickness of the semiconductor substrate passing through the back-side polishing process may be reduced from about 850 µm to 50 µm. After the back-side polishing process, the semiconductor substrate may pass through a dicing process, and may be made into semiconductor chips. The resultant semiconductor chip may be connected to another semiconductor chip or a packaging die, for example, a lead frame or printed circuit board.

FIG. 1A is a schematic view of a conventional semiconductor substrate provided with an elastic protecting layer.

Referring to FIG. 1A, a semiconductor device pattern 20 may be formed on a semiconductor substrate 10. The semiconductor device pattern 20 may include a plurality of hetero-materials having different thermal expansion coefficients, for example, an insulating layer composed of oxide or nitride and a metal layer composed of tungsten (W) or aluminum (Al). A passivation layer 30 may be stacked to protect the semiconductor device pattern 20 on the semiconductor substrate.

The semiconductor device pattern 20 and the passivation layer 30 may be composed of materials that are easily breakable, and they may be damaged due to a contact with a package die (not shown) that may envelop them or an external impact. Generally, an elastic protecting layer 40 with sufficient mechanical intensity and elasticity may be provided on the passivation layer 30 in order to protect the semiconductor device pattern 20 and the passivation layer 30. For example, the elastic protecting layer 40 may provide thermal conductivity for heat releasing, thermal resistance, and/or electric insulation.

FIG. 1B is a schematic view of a warpage phenomenon of a semiconductor substrate passing through a back-side polishing process.

Referring to FIG. 1B, a plurality of hetero-materials 20, 30, and 40 having different thermal expansion coefficients may be stacked on a semiconductor substrate 10*a*. A compressive stress may be generated about a central direction of the semiconductor substrate 10*a*. For example, the elastic protecting layer 40 may be formed as a thick layer compared to other stacked materials 20 and 30, and it may be a source of a compressive stress. The semiconductor substrate 10*a* may pass through the back-side polishing process. The semiconductor substrate 10*a* may be so thin that it may not have a sufficient stiffness to withstand the compressive stress. Thus, the semiconductor substrate 10*a* may be warped. The warpage may be from the bottom of the semiconductor substrate 10*a* toward the surface provided with the elastic protecting layer 40, and the corner of the semiconductor substrate 10*a* may be deformed to a height L.

A warped semiconductor substrate may induce performance defects in a semiconductor device. Further, the semiconductor substrate may be broken while being handled during a subsequent dicing process that may be used to form semiconductor chips. Packaging failure may also occur because sufficient contact area may not be available for the packaging die during the packaging process of the semiconductor chips.

SUMMARY

Example embodiments may provide a semiconductor chip that may relieve stress that may be applied to an elastic protecting layer as a semiconductor substrate passes through a back-side polishing process.

In an example embodiment, a semiconductor chip may include a semiconductor substrate that may have a semiconductor device pattern provided on a surface. A passivation layer may be provided on the semiconductor device pattern. At least one elastic protecting layer may be provided on the passivation layer. The at least one elastic protecting layer may have a pattern composed of grooves formed on a surface.

According to an example embodiment, the elastic protecting layer may be composed of one of silicon rubber-based, epoxy-based, polyimide-based, urethane-based, and fluorine-based materials, or a composition thereof.

According to an example embodiment, the elastic protecting layer may be composed of photosensitive polymeric materials.

According to an example embodiment of the present invention, the elastic protecting layer may have a thickness of 0.005 mm through 0.15 mm.

According to an example embodiment, the elastic protecting layer may have a stack structure composed of at least two different materials. Grooves may be formed on the uppermost surface of the elastic protecting layer.

According to an example embodiment, a depth of the grooves may be smaller than or equal to a thickness of the elastic protecting layer.

According to an example embodiment, the pattern may be composed of polygonal shapes, for example rectangular or triangular shapes, or circular shapes. A pitch of the pattern may be in a range of 100 µm through 500 µm. A width of the grooves may be in a range of 1 µm through 50 µm.

In an example embodiment, a method of fabricating a semiconductor chip may involve providing a passivation layer on a surface of a semiconductor substrate having a semiconductor device pattern. At least one elastic protecting layer may be provided on the passivation layer. Grooves may be repeatedly formed on a surface of the elastic protecting layer, thereby forming a pattern. A back side of the semiconductor substrate may be polished.

According to an example embodiment, the elastic protecting layer may be composed of one of silicon rubber-based, epoxy-based, polyimide-based, urethane-based, and fluorine-based materials, or a composition thereof.

According to an example embodiment, the elastic protecting layer may be composed of photosensitive polymeric materials.

According to an example embodiment, the elastic protecting layer may have a thickness in a range of 0.005 mm through 0.15 mm.

According to an example embodiment, the elastic protecting layer may be formed as a stack structure composed of at least two different component materials. The grooves may be formed on the uppermost surface of the elastic protecting layer.

According to an example embodiment, the grooves may be formed using a blade sawing, laser cutting, or photolithography method.

According to an example embodiment, a depth of the grooves may be smaller than or equal to a thickness of the elastic protecting layer.

According to an example embodiment, the pattern may be composed of polygonal shapes, for example rectangular or triangular shapes, or circular shapes. A shape of the pattern may be selected to decrease a stress applied on the semiconductor substrate by considering a difference between thermal expansion coefficients of the semiconductor substrate and the elastic protecting layer.

According to an example embodiment, a pitch of the pattern may be in a range of 100 μm through 500 μm. A width of the grooves may be in a range of 1 μm through 50 μm. The grooves may be formed along a scribe line of the semiconductor substrate.

According to an example embodiment, the method may further comprise patterning the elastic protecting layer to form a pattern having openings that may expose an electrode pad or a fuse line of the semiconductor substrate. The patterning of the elastic protecting layer may be performed concurrently with the forming of the pattern.

BRIEF DESCRIPTION OF THE DRAWINGS

Example, non-limiting embodiments the present invention will be described with reference to the attached drawings.

Figure 1A:
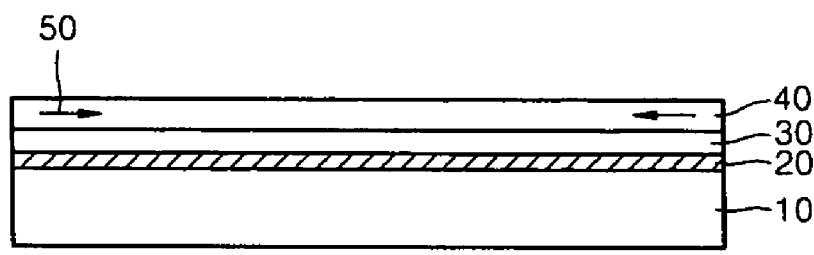
FIG. 1A is a schematic view of a conventional semiconductor substrate provided with an elastic protecting layer thereon.

The drawings are provided for illustrative purposes only and are not drawn to scale. The spatial relationships and relative sizing of the elements illustrated in the various embodiments may be reduced, expanded and/or rearranged to improve the clarity of the figure with respect to the corresponding description. The figures, therefore, should not be interpreted as accurately reflecting the relative sizing or positioning of the corresponding structural elements that could be encompassed by an actual device manufactured according to example embodiments of the invention. Like reference numerals in the drawings denote like elements, and thus their description may be omitted.

DESCRIPTION OF EXAMPLE, NON-LIMITING EMBODIMENTS

Example non-limiting embodiments will be described with reference to the accompanying drawings. The invention may, however, be embodied in many different forms and should not be construed as being limited to the embodiments set forth herein. Rather, the disclosed embodiments are provided so that this disclosure will be thorough and complete, and will fully convey the scope of the invention to those skilled in the art.

In the drawings, the thicknesses of layers and regions are exaggerated for clarity. Well-known structures and processes are not described or illustrated in detail to avoid obscuring the present invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Figure 2:
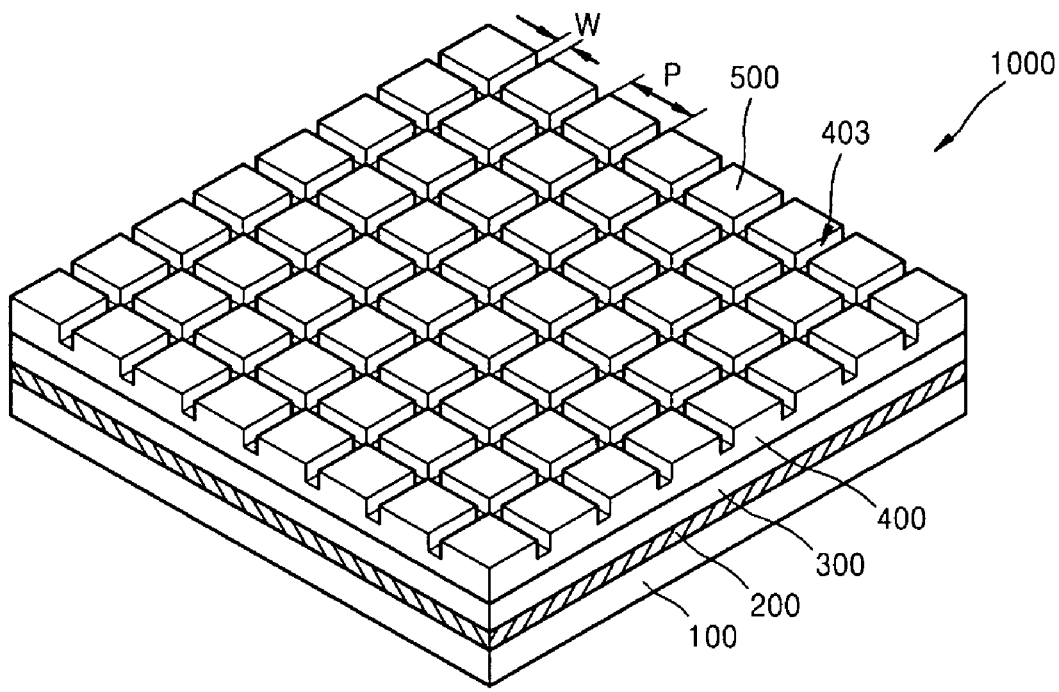
FIG. 2 is a perspective view of a semiconductor chip according to an example, non-limiting embodiment.

FIG. 2 is a perspective view of a semiconductor chip according to an example, non-limiting embodiment.

Referring to FIG. 2, a semiconductor chip 1000 may include a semiconductor substrate 100 that may have a semiconductor device pattern 200 provided on a surface. The semiconductor device pattern 200 may have a MOS transistor, an insulating layer, and an interconnection layer. A passivation layer 300 may be provided on the surface of the semiconductor device pattern 200. One or more elastic protecting layers 400 may be provided on the passivation layer 300. The elastic protecting layer 400 may include a pattern 500 composed of grooves 403 with a predetermined or desired depth, which may be repeatedly formed on a surface of the elastic protecting layer 400.

For example, the elastic protecting layer 400 may provide sufficient mechanical intensity and elasticity that may protect the semiconductor device pattern 200 and the passivation layer 300. The elastic protecting layer 400 may also provide a plasticity that may relieve a stress due to a difference between thermal expansion coefficients of the semiconductor chip 1000 and a package die (not shown) that may envelop the chip. Further, the elastic protecting layer 400 may provide thermal resistance, electric insulation, and the like.

By way of example only, the elastic protecting layer 400 may be composed of a material selected from one of silicon rubber-based, epoxy-based, polyimide-based, urethane-based, and fluorine-based materials, or a composition thereof in order to provide plasticity, thermal resistance, and/or electric insulation. For example, the elastic protecting layer 400 may instead be composed of a photosensitive polymeric material so that the pattern 500 may be formed using a photolithography process.

Figure 3A:
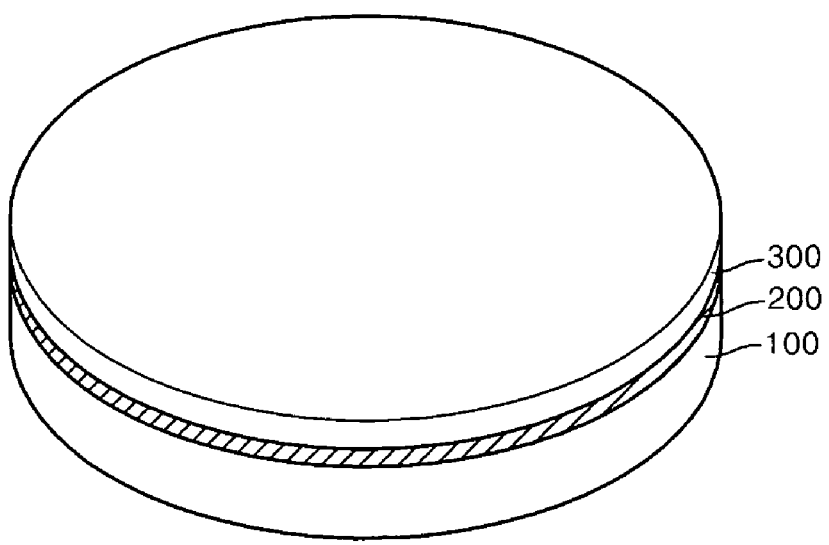
FIGS. 3A through 3E are perspective views of a method that may be implemented in fabricating a semiconductor chip according to example, non-limiting embodiments.
Figure 3B:
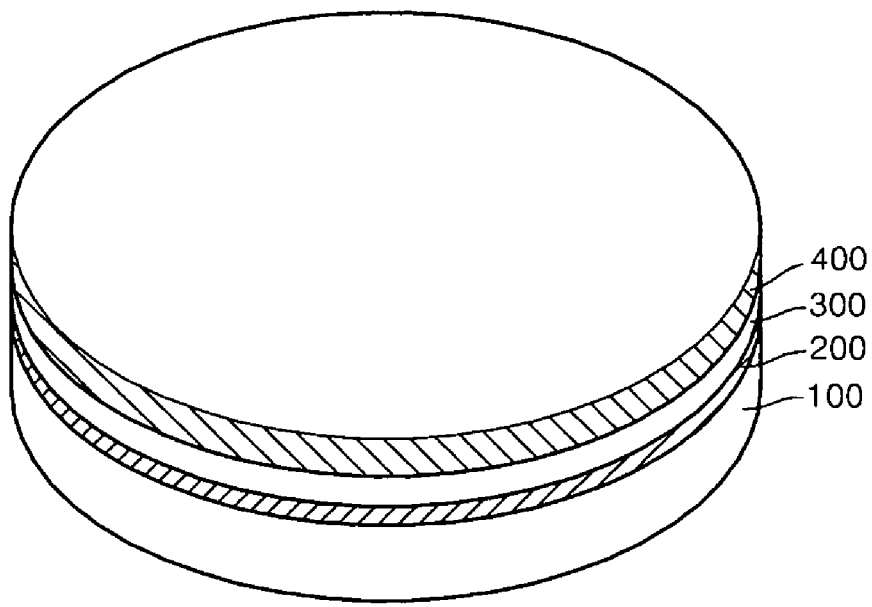
Figure 3C:
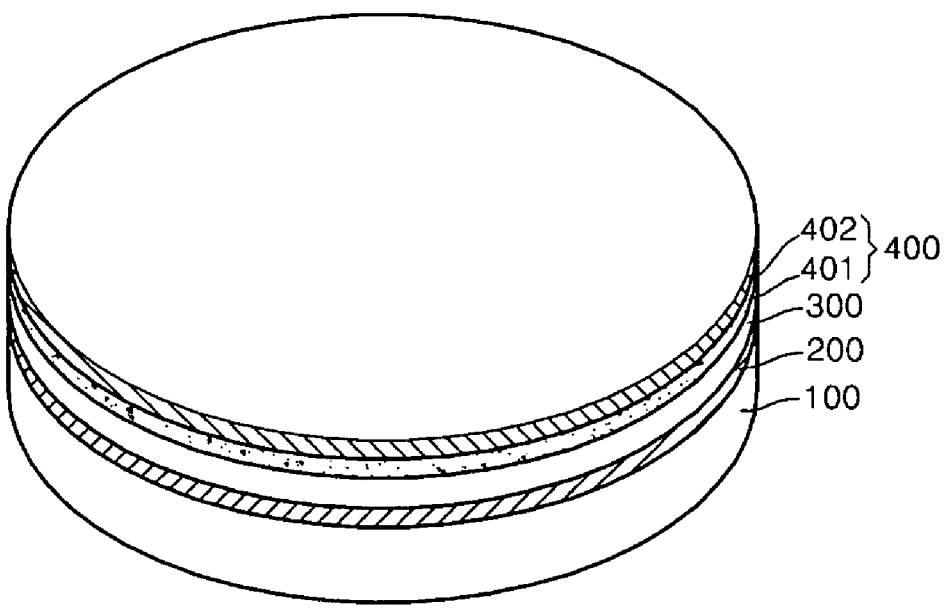

Referring to FIG. 3C, the elastic protecting layer 400 may have a stack structure composed of at least two different materials, for example, a double-layered structure of layers 401 and 402. Grooves 403 may be formed on the uppermost surface of the elastic protecting layer 400. A depth of the grooves 403 may be smaller than or equal to a thickness of the elastic protecting layer 400.

For example, the pattern 500 may be composed of polygonal shapes, for example rectangular or triangular shapes, or circular shapes. A pitch p of the pattern 500 may be in a range of 100 μm through 500 μm. A width w of the grooves 403 may be in a range of 1 μm through 50 μm.

For example, the pattern 500 provided on a surface of the elastic protecting 400 layer may relieve stress that may cause defects in the semiconductor device. Another thicker elastic protecting layer may be provided to enhance the mechanical intensity, thermal resistance, and electric insulation of the elastic protecting layer 400.

FIGS. 3A through 3E are perspective views of a method of fabricating a semiconductor chip according to example, non-limiting embodiments.

Referring to FIG. 3A, a semiconductor chip may include a semiconductor substrate 100 that may have a semiconductor device pattern 200 provided on a surface. The semiconductor device pattern may include an MOS transistor, an insulating layer, and an interconnection layer. A passivation layer 300 may be provided on the semiconductor substrate 100.

For example, the passivation layer may protect the semiconductor device pattern 200 and the semiconductor substrate 100. By way of example only, the passivation layer 300 may be formed from oxide nitride, or the like. By way of example only, the insulating layer may be composed of an oxide or a nitride and the interconnection layer may be composed of tungsten or aluminum.

Referring to FIG. 3B, at least one elastic protecting layer 400 may be provided on the passivation layer 300. For example, the elastic protecting layer 400 may provide sufficient mechanical intensity and elasticity to protect the semiconductor pattern 200 and the passivation layer 300 from contact with a package die (not shown) or from an external impact. The elastic protecting layer 400 may also provide a plasticity that may alleviate stress due to a difference between thermal expansion coefficients of the semiconductor chip and a package die mounting the chip after a dicing process. Further, the elastic protecting layer 400 may provide thermal resistance and electric insulation.

By way of example only, the elastic protecting layer 400 may be composed of a material selected from one of silicon rubber-based, epoxy-based, polyimide-based, urethane-based, and fluorine-based materials, or a composition thereof capable of performing above functions. Further, the elastic protecting layer 400 may be composed of photosensitive polymeric materials. When the elastic protecting layer 400 is composed of the photosensitive polymeric materials, a pattern 500 may be formed on the surface of the elastic protecting layer 400 using a photolithography process.

For example, the elastic protecting layer 400 may be provided on a surface of the semiconductor substrate by a spin-coating method using a mixture of polymeric material and solvent providing an appropriate viscosity. The polymeric material may be hardened, for example, using a heat dry method or any other appropriate method.

For example, the elastic protecting layer 400 may be provided with a thickness of 0.005 mm through 0.15 mm to provide a sufficient mechanical intensity and a sufficient thermal resistance property.

Referring to FIG. 3C, the elastic protecting layer 400 may be formed as a stacked structure composed of at least two different materials, for example, a double-layered structure of layers 401 and 402. For example, the double-layered structure 400 may have improved plasticity, mechanical intensity, thermal resistance, and/or electric insulation over a single-layered elastic protecting layer 400 (FIG. 3B) with the same thickness. For example, the elastic protecting layer 400 may have a stacked structure composed of three layers or more.

Figure 3D:
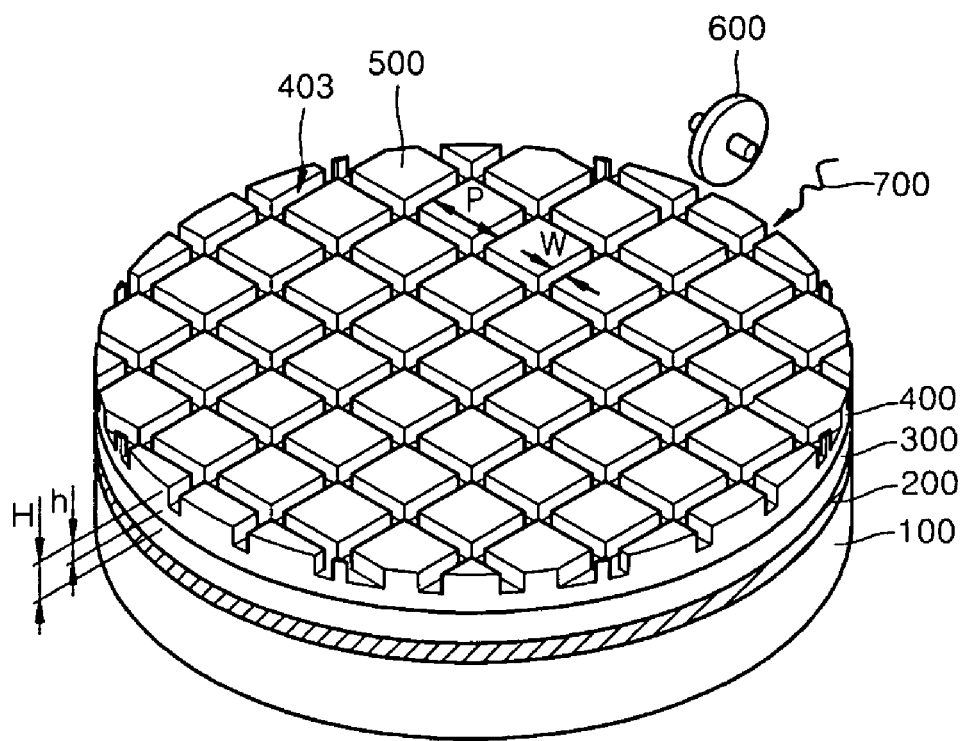

Referring to FIG. 3D, grooves 403 with a predetermined or desired depth may be repeatedly formed on a surface of the elastic protecting layer 400, thereby forming a pattern 500. A depth h of the grooves 403 may be smaller than or equal to a thickness H of the elastic protecting layer 400.

By way of example only, the grooves 403 may be formed using a blade sawing method, laser cutting method, or photolithography method. For example, in the blade sawing method a cutting blade 600 may be rotated at a predetermined or desired speed, for example, about 20000 rpm, and the rotating cutting blade 600 may be made to contact a surface of the elastic protecting layer 400 so that grooves 403 may be formed on the contact surface with a predetermined or desired depth. In the laser cutting method, a laser beam 700 may be focused on a surface of the elastic protecting layer 400 to cut grooves 403 at a predetermined or desired depth h. If the elastic protecting layer 400 is composed of photosensitive polymeric materials, the elastic protecting layer 400 may be exposed using a photo mask (not shown) having a groove pattern formed thereon, and may be developed so that grooves 403 may be formed on the elastic protecting layer 400 (photolithography method).

By way of example only, the pattern 500 may be composed of polygonal shapes, for example rectangular or triangular shapes, or circular shapes. For example, the shape of the pattern 500 may be selected to relieve stress that may be applied on the semiconductor substrate 100 by considering a difference between thermal expansion coefficients of the semiconductor substrate 100 and the elastic protecting layer 400. If the elastic protecting layer 400 is formed as a stacked structure composed of different materials, for example, a double-layered structure of layers 401 and 402, the grooves 403 may be formed only on an uppermost layer 402 of the elastic protecting layer 400 to form the pattern 500.

By way of example only, the pitch p of the pattern may be in a range of 100 μm through 500 μm and the width w of the groove 403 may be 1 μm through 50 μm. Further, the pattern 500 may be formed along scribe lines on the semiconductor substrate 100.

The method may further include a process of patterning the elastic protecting layer 400 to expose, for example, an electrode pad (not shown) or a fuse line (not shown) formed in semiconductor device pattern 200. By the patterning process, the electrode pad (not shown) may be electrically connected to a lead frame (not shown) and the exposed fuse line (not shown) may allow a performance test for the semiconductor device to be performed. The process of patterning the elastic protecting layer 400 and the process of forming the pattern 500 may be performed concurrently. By way of example only, the elastic protecting layer 400 can be patterned using an irradiation of laser beam or a photolithography method. In this way, the electrode pad or fuse line may be exposed concurrently with the formation of the pattern 500.

Figure 3E:
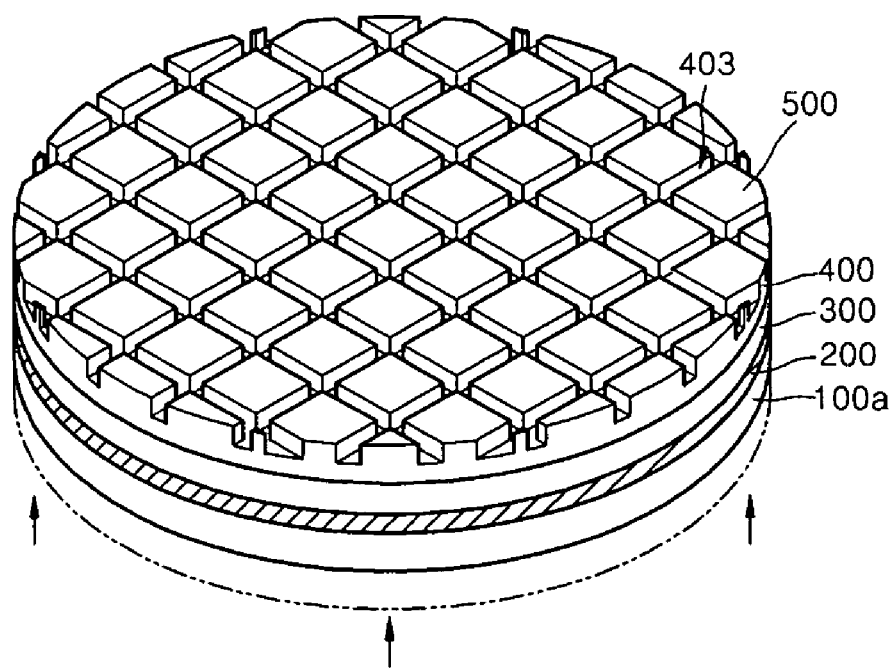

Referring to FIG. 3E, the back side of the semiconductor substrate 100 may be polished so that a semiconductor substrate 100a may have a predetermined or desired thickness for packaging. By way of example only, the back side of the semiconductor substrate 100 may be polished by rotating a grinding wheel (not shown) at a high speed. A contamination-preventive tape (not shown) may be provided to prevent contamination of an upper surface of the semiconductor substrate 100.

For example, after the back-side polishing process, the semiconductor substrate 100a may be divided along a scribe line (not shown) of the semiconductor substrate 100a into semiconductor chips by a dicing process as known to those in this art. A discrete semiconductor chip then may be packaged through a packaging process.

Figure 1B:
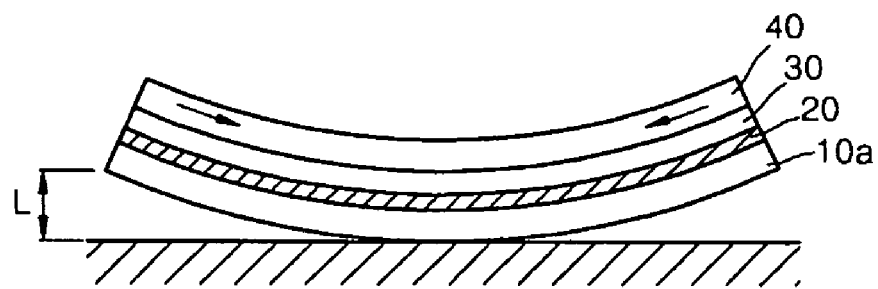
FIG. 1B is a schematic view of a warpage phenomenon of a conventional semiconductor substrate passing through a back-side polishing process.

Table 1, included below, shows measurement results of the warpage of example semiconductor substrates made by forming a polyimide elastic protecting layer with a thickness of 5 μm, and performing a back-side polishing process to reduce a thickness of the semiconductor substrate to 80 μm. The patterns in the example embodiments were formed with rectangular shapes with a size of 300 μm, and a pitch of 320 μm. The warpage of the semiconductor substrates was examined by measuring a maximum height L (FIG. 1B) at which a corner of the semiconductor substrate was spaced from a ground surface.

TABLE 1

| without a mesh pattern | with a mesh pattern formed |
|---|---|
| 53.36 μm | 15.53 μm |

Referring to Table 1, the warpage of the semiconductor substrate when a pattern was formed according to the example embodiments was reduced to about 71% compared to that of the semiconductor without a pattern. Further, when the pitch of the pattern and the width of the grooves were both smaller, the warpage of the semiconductor substrate was reduced. Thus, a compressive stress that may have been applied on the semiconductor substrate may have been relieved when the mesh pattern was formed on the elastic protecting layer.

As shown in FIGS. 3A through 3E, the method of fabricating a semiconductor chip may involve forming a mesh pattern on a surface of the elastic protecting layer, which may relieve a stress on the elastic protecting layer with respect to the semiconductor substrate passing through a back-side polishing process. Further, the method may enable the thickness of the elastic protecting layer to be increased to enhance mechanical intensity, thermal resistance, and/or electric insulation for the semiconductor packaging.

Example, non-limiting embodiments may be employed in various packaging processes that may electrically connect a semiconductor chip with an external pad and may protect the semiconductor chip from the external environment For example, a dual inline package (DIP), small outline package (SOP), quad flat package (QFP), ball grid array package (BGA), and/or chip scale package (CSP).

The present invention has been shown and described with reference to example embodiments. It will be understood by those of ordinary skill in the art that various changes in form and details may be suitably implemented without departing from the spirit and scope of the present invention as defined by the following claims.

What is claimed is:

1. A semiconductor chip comprising:
a semiconductor substrate having a semiconductor device pattern provided on a surface;
a passivation layer provided on the semiconductor device pattern; and
at least one elastic protecting layer provided on the passivation layer, the at least one elastic protecting layer having grooves formed on a surface of the elastic protecting layer that form a pattern.

2. The semiconductor chip of claim 1, wherein the at least one elastic protecting layer is composed of one of silicon rubber-based, epoxy-based, polyimide-based, urethane-based, and fluorine-based materials, or a composition thereof.

3. The semiconductor chip of claim 1, wherein the at least one elastic protecting layer is composed of photosensitive polymeric material.

4. The semiconductor chip of claim 1, wherein the at least one elastic protecting layer has a thickness in a range of 0.005 mm through 0.15 mm.

5. The semiconductor chip of claim 1, wherein the at least one elastic protecting layer has a stacked structure with at least two layers composed of different materials.

6. The semiconductor chip of claim 5, wherein the grooves are formed on the uppermost layer of the stacked structure.

7. The semiconductor chip of claim 1, wherein a depth of the grooves is smaller than or equal to a thickness of the at least one elastic protecting layer.

8. The semiconductor chip of claim 1, wherein the pattern is composed of polygonal shapes or circular shapes.

9. The semiconductor chip of claim 1, wherein a pitch of the pattern is in a range of 100 μm through 500 μm.

10. The semiconductor chip of claim 1, wherein a width of the grooves is in a range of 1 μm through 50 μm.

11. A method of fabricating a semiconductor chip comprising:
providing a passivation layer on a surface of a semiconductor substrate having a semiconductor device pattern;
providing at least one elastic protecting layer on the passivation layer;
forming grooves on a surface of the at least one elastic protecting layer, thereby forming a pattern; and
polishing a back side of the semiconductor substrate.

12. The method of claim 11, wherein the at least one elastic protecting layer is composed of one of silicon rubber-based, epoxy-based, polyimide-based, urethane-based, and fluorine-based materials, or a composition thereof.

13. The method of claim 11, wherein the at least one elastic protecting layer is composed of photosensitive polymeric material.

14. The method of claim 11, wherein the at least one elastic protecting layer has a thickness in a range of 0.005 mm through 0.15 mm.

15. The method of claim 11, wherein the grooves are formed using a blade sawing, a laser cutting, or a photolithography method.

16. The method of claim 11, wherein a depth of the grooves is smaller than or equal to a thickness of the at least one elastic protecting layer.

17. The method of claim 11, wherein the pattern is composed of polygonal shapes or a circular shapes.

18. The method of claim 11, wherein a shape of the pattern is selected to relieve a stress applied on the semiconductor substrate by considering a difference between thermal expansion coefficients of the semiconductor substrate and the at least one elastic protecting layer.

19. The method of claim 11, wherein a pitch of the pattern is in a range of 100 μm through 500 μm.

20. The method of claim 11, wherein a width of the grooves is in a range of 1 μm through 50 μm.

21. The method of claim 11, wherein the grooves are formed along a scribe line of the semiconductor substrate.

22. The method of claim 11, wherein the at least one elastic protecting layer has a stacked structure with at least two layers composed of different materials.

23. The method of claim 22, wherein the grooves are formed on the uppermost layer of the stacked structure.

24. The method of claim 11, further comprising patterning the at least one elastic protecting layer to form a pattern having openings exposing an electrode pad or a fuse line of the semiconductor substrate.

25. The method of claim 24, wherein patterning the at least one elastic protecting layer is performed concurrently with forming the pattern.

\* \* \* \* \*